United States Patent [19]

Walters

[11] Patent Number: 4,952,420

[45] Date of Patent: Aug. 28, 1990

[54] VAPOR DEPOSITION PATTERNING METHOD

[75] Inventor: Glenn J. Walters, Duxbury, Mass.

[73] Assignee: Advanced Dielectric Technologies, Inc., Taunton, Mass.

[21] Appl. No.: 256,695

[22] Filed: Oct. 12, 1988

[51] Int. Cl.$^5$ .......................... B05D 5/12; B05D 1/32
[52] U.S. Cl. ........................................ 427/97; 427/99; 427/272; 505/1; 505/741
[58] Field of Search ....................... 118/721, 505, 623; 427/99, 272, 97, 282; 505/1, 741

[56] References Cited

U.S. PATENT DOCUMENTS

| | | | |
|---|---|---|---|
| 4,022,928 | 5/1977 | Piwcyzk | 427/43.1 X |
| 4,373,470 | 2/1983 | Martin | 427/282 X |

FOREIGN PATENT DOCUMENTS 0220685  5/1987  European Pat. Off. ............ 118/721

OTHER PUBLICATIONS

Tzanavaras, G., "Hold-Down Technique for Metal Masks Using Permanent Magnets," IBM TDB, vol. 20, No. 1, Jun. 1977, p. 364.

*Primary Examiner*—Evan Lawrence
*Attorney, Agent, or Firm*—Wolf, Greenfield & Sacks

[57] ABSTRACT

An etchless patterning method for depositing material patterns upon substrates. The method involves providing substrate to be patterned, immobilizing a patterned physical mask upon a mask carrier, transferring the mask from the carrier to contact the substrate, immobilizing the mask upon the substrate while removing the mask carrier, exposing the masked substrate to vapor phase pattern material in a vacuum, reimmobilizing the mask upon the mask carrier and removing the mask from the substrate in a manner that allows the mask to remain immobilized on the mask carrier. The process is particularly well suited for the production of circuit boards or electronic applications.

32 Claims, 1 Drawing Sheet

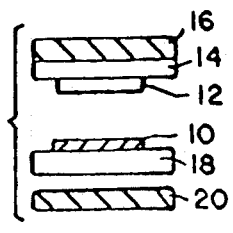 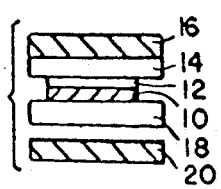 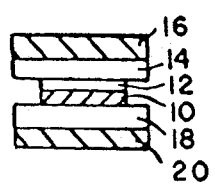 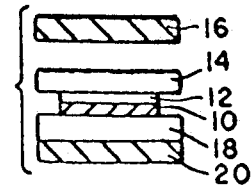
FIG.1a　　FIG.1b　　FIG.1c　　FIG.1d
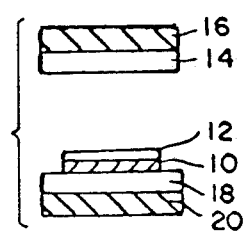 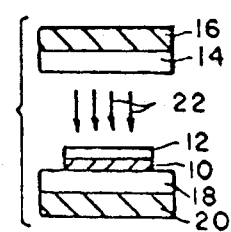 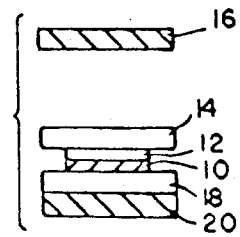 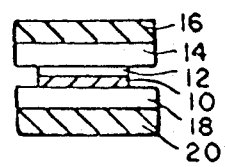
FIG.1e　　FIG.1f　　FIG.1g　　FIG.1h
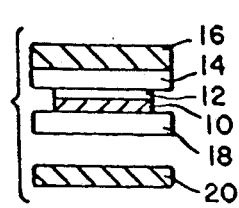 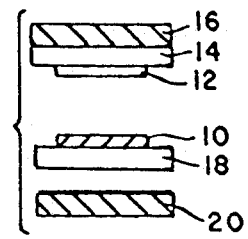
FIG.1i　　FIG.1j

VAPOR DEPOSITION PATTERNING METHOD

BACKGROUND OF THE INVENTION

The ability to produce material patterns on substrates is of substantial industrial importance. In particular, the ability to provide high quality conducting patterns on substrates is essential in the production of circuit boards for the electronics industry. Such patterned substrates also have utility in electrical resistance heating plates, microwave oven doors and a variety of utilitarian and ornamental applications.

In conventional circuit board manufacturing techniques, a continuous metallic foil is typically bonded onto a substrate. However, in some cases, the foil has been substituted by a continuous metallic coating which has been plated or vapor deposited directly on the substrate. A resist is then applied to the substrate in a pattern which defines the desired pattern. The resist generally comprises an organic resin or ink applied through a screen in the desired pattern. A more common processing method, however, uses radiation-sensitive compounds, termed photoresists, which can be imaged or exposed through a suitable patterned mask and then developed. Such photoresists can be of the negative or positive acting type and can be applied as a liquid or a dry film. These photoresists are often of a type which can be developed and stripped using aqueous or organic solvents. The liquid type photoresists are generally applied in a continuous, uniform coating by spraying, roller coating or screen printing.

After developing the photoresist to form a patterned mask, etchants are used to remove exposed metallic material. Subsequently, the remaining mask material is removed. The resulting product is a pattern of metallic material bonded to the substrate surface. At some point prior to, during or subsequent to the patterning process, through-holes are drilled in appropriate locations on the substrate. The interior surfaces of these through-holes are subsequently metallized by any of a variety of known techniques.

The method described above is intended merely to be representative of a variety of different processes, and is not intended to provide an exhaustive description of all currently practised circuit board manufacturing techniques.

Unfortunately, the use of etchants in the formation of patterns upon substrates results in a process having a variety of disdvantages. For example, commonly used etchants can be costly and are typically hazardous in handling and disposal. Additionally, the removal of sections of the metallic material results in etchant attack on the sidewalls of remaining material. This effect, referred to as etch factor, creates difficulties when forming extremely narrow metallic traces on the circuit board, thereby limiting the overall device density on the board. Furthermore, patterning of the substrate using etchants results in the need for a variety of pre- and post-etch process steps, thereby increasing manufacturing time, complexity and scrap rates.

Additionally, the thin foil sheets used in conventional patterning techniques are exceptionally fragile and susceptible to damage. Thus, extreme care must be employed during foil handling and processing. This required care results in additional process complexity and added process costs.

Thus, a need exists for a method for providing layers of pattern material on a substrate in a manner which is efficient, inexpensive and reduces the hazards associated with etchant handling and disposal.

SUMMARY OF THE INVENTION

The invention pertains to an etchless method for directly depositing patterned materials on substrates as well as to the products produced thereby. More specifically, the invention pertains to a process for producing a material pattern on a substrate by placing a patterned physical mask immobilized on a mask carrier over the substrate immobilizing the mask on the substrate, removing the carrier, and vapor depositing a pattern material through the mask onto the substrate. Unlike photolithographic methods for removing pattern materials upon substrates, the present invention eliminates the need to produce individual masks on each substrate to be patterned and also eliminates the need to remove pattern material from the substrate surface using etchants. The elimination of the etching step provides a process which is faster, less costly, requires no processing chemicals, and eliminates safety and disposal problems which result from the use of known etching systems.

The present invention is particularly useful for the production of circuit boards for electronic applications. This is a result of the direct vapor deposition process which allows patterned material to be directly deposited on the interior surfaces of substrate through-holes simultaneously with the deposition of the pattern on the substrate surface. Such a process provides deposited through-hole material which is integrally continuous with the pattern material on the substrate surface. This provides enhanced circuit board performance as it eliminates discontinuities which occur at through-hole/surface interfaces via conventional through-hole electroplating deposition processes. Additionally, the simultaneous through-hole vapor deposition eliminates many of the subsequent process steps required in previous circuit board manufacturing processes.

The advantages of this etchless patterning method include the ability to deposit thinner patterns than previously obtainable, the elimination of toxic or corrosive chemicals during the plating and etching process, the elimination of adhesives between the pattern material and the substrate, the elimination of time consuming pre-etch, etch and post-etch steps, and the deposition of a more uniform pattern layer. The elimination of an adhesive bond between the pattern material and the substrate provides advantages such as an improved adhesion of the pattern material to the substrate, the ability to operate the patterned substrate at temperatures in excess of those specified for adhesives and the elimination of contaminants resulting from excess adhesive.

BRIEF DESCRIPTION OF THE DRAWING

FIG. 1 is a schematic representation of one embodiment of the process of the invention.

DETAILED DESCRIPTION OF THE INVENTION

The present invention is an etchless method for the vapor deposition of patterned materials directly on substrates. Unlike previous methods for producing material patterns on substrates, the present invention eliminates the need to remove regions of a continuous material that do not constitute regions of the pattern. Rather, the instant method comprises a direct vapor deposition of pattern materials onto a substrate using a patterned physical mask. In the embodiment where the pattern materials form the conductive traces of a circuit board, the present method allows vapor deposition of circuit board through-holes to occur simultaneously with the deposition of the pattern traces.

The substrates upon which patterned vapor deposition is to occur can comprise substantially any solid substrate material which is substantially undamaged by exposure to a vacuum containing the pattern materials in the vapor phase. As such, preferred substrate materials include, but are not limited to, materials such as polymers, metals and metallic alloys, crystalline materials such as silicon, germanium, and other semiconductor materials and amorphous materials such as glass and sapphire. In a preferred embodiment, in which the patterned material forms the conductive traces of a circuit board, the substrate can comprise electrically insulating materials such as polymer films, thermosetting resins, thermoplastic resins and combinations thereof. These materials can be reinforced with fibers to add strength to the substrate. In some cases, it may be desirable to roughen the substrate surface prior to pattern deposition in order to enhance pattern adhesion. Such roughening can be produced by a variety of known chemical and physical methods. Alternately, the substrate can be roughened using electrical methods such as corona discharge. However, in order to reduce process complexity, substrate roughening is preferably avoided unless necessary to properly adhere the pattern material.

The pattern material to be deposited can be any material which can be deposited upon substrates by vapor deposition processes. As such, pattern materials can comprise, but are not intended to be limited to, materials such as metals and metallic alloys, polymeric materials such as thermoplastics, elemental carbon, and inorganic materials such as ceramics. In a preferred embodiment, the pattern materials can comprise superconducting materials such as alloys of Y, Ba, Cu and O. In the embodiment in which the patterned substrate comprises a circuit board, the pattern material preferably comprises a conductive metal such as copper, silver, gold, aluminum or combinations thereof. Subsequent to pattern deposition, the pattern material can also serve as a foundation for additional material. Thus, in the case of circuit boards, a nickel-gold multilayer can be deposited upon regions of the pattern to provide enhanced contact areas and solder can be deposited in selected regions for the purpose of mounting surface mounted devices.

The vapor deposition process can be any process in which materials are deposited upon substrates in the vapor phase. As such, methods such as chemical and physical vapor deposition (CVD and PVD), which include sputtering, electron beam and resistive or inductive heating are intended to be included herein. It is pointed out that while these methods for providing the pattern material in vapor phase are preferred, the invention is not intended to be limited as such. Rather, any method for supplying pattern material in a vapor phase can be used, provided the method does not damage the substrate or the patterned physical mask.

The present invention makes use of patterned physical masks to define the regions upon the substrate in which deposition is to occur. Such patterned physical masks can comprises liquid phase masks, such as oils, which are printed onto the substrate via batch or continuous processes. In a preferred embodiment, however, the patterned masks comprise solid materials which are maintained in intimate contact with the substrate during the vapor phase process. Such masks must be capable of maintaining their structural integrity while in contact with the substrate and vapor phase pattern materials. As such, preferred masks can be formed from materials such as metals and metallic alloys and ceramics. When metal or metallic alloy masks are used, magnetically active metals are preferred. Alternatively, the masks can be formed of polymeric materials such as thermoplastics. In the case of patterned polymeric masks, thermoplastic materials which can be electrostatically sensitized are preferred. Alternatively, such polymeric masks can comprise thermoplastics containing metallic loading to thereby render them magnetically active.

In a broad embodiment, the method of the present invention comprises providing the substrate upon which the pattern is to be deposited, providing a patterned physical mask which is the negative of the pattern to be deposited, maintaining the patterned mask in intimate contact with the substrate, exposing the mask and substrate to a vacuum containing the pattern material in vapor phase under conditions which allow the pattern material to be deposited on exposed regions of the substrate, and allowing the pattern material to deposit on the exposed substrate to a desired thickness. Subsequently, the deposition step is halted and the mask is removed. The resulting substrate surface is found to contain pattern material on the regions which were exposed by the patterned mask.

In a preferred embodiment, the mask comprises a patterned metallic sheet such as a steel foil. Patterned masks of this type can be readily prepared by any of a variety of known methods.

Unlike the etchless patterning method of this invention, the preferred method for the preparation of patterned metallic masks makes use of photolithographic techniques. In this method, a photoresist layer is coated upon a metal sheet and the sheet is patterned using a conventional photomask. Subsequently the patterned sheet is etched using conventional etchant materials and processes. However, rather than terminating the etching process at an early point, the process is allowed to continue until the metal sheet has been etched entirely through. The resulting metal, patterned mask is then suitable for defining regions on a substrate onto which a pattern material is to be directly deposited.

Although masks produced by the method described above are generally flexible and relatively fragile, mask damage can be reduced or eliminated by immobilizing the metal sheet throughout its processing and use as a mask. In a preferred embodiment, the metal sheet is magnetically immobilized on an a mask carrier plate prior to being etched. The mask carrier plate preferably comprises titanium, however, any solid material through which a magnetic field can pass and which is impervious to the etchants employed during mask production can be used. The metal sheet is processed as described above to provide a mask. Throughout its processing, it is maintained in an immobilized state upon the mask carrier plate via the magnetic attraction of a magnet placed on the opposite side of the mask carrier plate. The magnet can be an electromagnet, or alternatively, it can be a permanent magnet which can be disengaged from the mask carrier plate. In the case of the electromagnet, the magnetic field can be engaged and disengaged by energizing and de-energizing the magnet. Alternatively, if a permanent magnet is used, the field is engaged and disengaged by varying the distance of the magnet from the mask carrier plate. The immobilization serves to protect the mask from damage occurring from flexing and additionally serves to maintain isolated mask sections in the proper orientation with the remainder of the mask.

When using an immobilized mask, as described above, for deposition of a pattern material on a substrate, the substrate is preferably placed on a substrate carrier plate. The substrate carrier plate can be identical to the mask carrier plate in both material and construction. At this point, the magnetic field below the substrate carrier plate is not engaged. The mask carrier plate, having the mask immobilized thereon is lowered toward the substrate carrier plate until the mask is in intimate contact with the substrate. The field of the magnet located below the substrate carrier plate is engaged, and subsequently the field of the mask carrier plate is demagnetized, thereby allowing the substrate carrier plate to magnetically attract the mask, thus magnetically immobilizing the mask in intimate contact with the substrate. At this point, the mask carrier plate is removed and a vapor phase pattern material is deposited upon the exposed sections of the substrate.

Upon completion of the deposition, the mask carrier plate is lowered onto the mask and magnetized. The substrate carrier plate is then demagnetized, thereby allowing the mask carrier plate to reacquire the mask. The mask can then be lifted from the patterned substrate and reused in the patterning of additional substrates.

The process described above can be more specifically pointed out with reference to FIG. 1. In FIG. 1(a), the substrate 10, mask 12, mask carrier plate 14, mask carrier plate magnet 16, substrate carrier plate 18 and substrate carrier plate magnet 20 are shown in the initial process configuration. The mask carrier plate magnet 16 has been placed in close proximity to the mask carrier plate 14 to thereby immobilize the mask 12 on the mask carrier plate 14. The substrate 10 is positioned upon substrate carrier plate 18 and substrate carrier plate magnet 20 is located in a remote position. In FIG. 1(b), the mask 12 and mask carrier plate assembly has been positioned to provide the mask 12 in intimate contact with the substrate 10. In FIG. 1(c), the substrate carrier plate magnet 20 is moved into close proximity to the substrate carrier plate 18 to thereby allow its magnetic field to attract the mask 12. FIG. 1(d) shows the removal of mask carrier plate magnet 16 from the mask carrier plate 14. This allows the mask 12 to be immobilized onto the substrate 10, solely by the attraction of the substrate carrier plate magnet 20. In FIG. 1(e), the mask carrier plate 14 has been removed from the surface of the immobilized mask 12, thereby exposing both the mask and the substrate surfaces underlying mask cut-outs.

The deposition of a vapor phase pattern material 22 is shown in FIG. 1(f). This deposition is allowed to proceed until a desired amount of pattern material has been deposited. Subsequently, the deposition is halted, and the mask carrier plate 14 is returned to the exposed surface of the mask 12 as shown in FIG. 1(g). The mask carrier plate magnet 16 is then returned to close proximity to the mask carrier plate 14 as shown in FIG. 1(h). At this point, the mask 12 is attracted again by both carrier plate magnets 16 and 20. In FIG. 1(i), the substrate carrier plate magnet 20 is removed from close proximity to the substrate carrier plate 18. This results in the mask 12 being immobilized solely by the mask carrier plate magnet 16. Finally, in FIG. 1(j), the mask 12, mask carrier plate 14 and mask carrier plate magnet 16 are removed. The resulting configuration is similar to that of FIG. 1(a), except the substrate 10 now has a material pattern deposited upon its surface. The patterned substrate can now be removed from the substrate carrier plate 16 and replaced with an unpatterned substrate. The process can then be repeated.

In a preferred embodiment, following the vapor deposition step depicted in FIG. 1(f), an unpatterned substrate can be placed upon mask 12 prior to immobilizing the mask on carrier plate 14. Thus, when the patterned substrate is disengaged from the mask, the mask will be immobilized upon a new unpatterned substrate with the unpatterned substrate maintained between the mask and the mask carrier plate. Patterning of this substrate can then be carried out as depicted in FIG. 1(f). By continuously repeating this process, this embodiment eliminates the need for additional steps to transfer the mask from a carrier plate onto an unpatterned substrate and thereby enhances process efficiency.

As an alternative to the above process, the mask can comprise a material which is susceptible to immobilization via electrostatic means. Suitable masks for this embodiment include masks formed of polymer films. The substrates and carrier plates used in this embodiment must also be susceptible to maintaining an electrostatic charge. As such, electrically insulating substrates and carrier plates are necessary if electrostatic immobilization methods are to be employed. As before, the mask is preferably immobilized throughout its production and use. Also as in the case of metal masks, the mask is lowered onto the substrate and immobilized thereon. Subsequent to patterning, however, the mask can either be discarded or immobilized back onto the carrier plate for additional use. Although metal masks can be discarded after each use as well, their durability suggests that they will generally display a longer useful service life than masks constructed from polymer films. Regardless of the mask type employed, if the mask is to be reused, it is preferable to clean the mask after each deposition process.

In yet another embodiment of the invention, the patterned mask can be immobilized on the substrate via adhesive means. In such an embodiment, the adhesives must be selected to be such that they are not detrimentally affected by the vapor deposition process. Unlike the previously described embodiments, however, the use of adhesives to immobilize the patterned mask on the substrate often requires the use of chemicals to remove the mask or the adhesives subsequent to the patterning step.

It is emphasized that the use of means to immobilize the mask is preferred only when the physical nature of the mask is such that it would be damaged or otherwise affected by handling procedures not involving immobilization. Thus for masks constructed of rigid materials having no isolated mask sections, the use of a means for immobilizing the mask during its production and use may not be necessary.

The invention is particularly well suited for depositing metallic patterns upon substrates for the production of circuit boards. As well as providing an improved method for depositing the metallic pattern, the process allows the simultaneous vapor deposition of pattern material on the interior surface of through-holes which pass through the substrate, thereby eliminating additional process steps to provide pattern material on the interior surfaces of these through-holes. In this embodiment, a substrate having a pattern of through-holes is provided. The mask is provided on the substrate surface and any necessary registration of the mask with the through-holes is performed. Subsequently, the environment surrounding the mask and substrate is evacuated, and deposition of vapor phase pattern material upon exposed areas of the substrate is commenced. In substrate regions having exposed through-holes, deposition of the pattern material will occur upon the exposed, inner surfaces of the through-holes as well as upon the surface of the substrate which is not covered by the mask. Upon completion of the deposition, the mask is removed and patterned regions can be subjected to additional processing, such as the selective deposition of contact areas or the plating of solder pads if desired.

If the through-holes have a high aspect ratio (i.e., a length to diameter ratio of greater than about 1), the vapor deposition process may result in a non-uniform distribution of pattern material on the interior surfaces of the through-holes. In order to overcome this nonuniformity, it may be desirable to alter the through-hole geometry to improve deposition. In a preferred embodiment, the through-holes are countersunk prior to vapor deposition. Countersinking can be performed on a single surface of the substrate, or preferably, at each end of the through-hole. The resulting substrate, having a pattern of countersunk through-holes, is then subjected to a vapor deposition of pattern material as previously described. The countersinking of through-holes provides a patterned substrate having a high quality, uniform, pattern material deposition on the interior surfaces of the through-holes.

The resulting circuit board is unique in that it has a pattern deposited directly upon the substrate wherein the pattern is integrally continuous with the material deposited on the inner surfaces of through-holes. Thus, unlike previous circuit boards which required subsequent through-hole vapor deposition and a resulting discontinuation at the through-hole entrances, the circuit boards of the present invention have, deposited on the interior surfaces of through-holes, a pattern material which is integrally associated with the surface pattern material. This results in enhanced circuit board performance while eliminating additional through-hole plating deposition steps during circuit board manufacture.

The process can also be applied to produce material patterns on rigid substrates as well as flexible substrates and combinations thereof. Electronic applications such as chip carriers and flexible wiring are intended to be included herein as well.

It should be pointed out that the invention is not intended to be limited to the production of circuit boards nor to the formation of metallic patterns on substrates. Rather, a variety of pattern materials including polymers and ceramics can be deposited on substantially any solid substrate which is not detrimentally damaged by the direct vapor deposition process.

In another embodiment of the invention, thin, multi-layer circuit boards can be readily fabricated by producing a dielectric layer directly upon a patterned substrate and subsequently depositing a material pattern upon the dielectric layer. Suitable dielectric materials comprise any material which can be deposited in a uniform thin film upon a patterned substrate, can maintain its dielectric properties throughout repeated processing and use, and can serve as a substrate for the deposition of subsequent material pattern layers. In a preferred embodiment, the interlayer dielectric material comprises a coating of polyetherimide, polycarbonate, polysulphone, or a combination thereof. By repeatedly laying down dielectric layers and material pattern layers, circuit boards having at least two vertically disposed patterned layers can be produced.

In yet another embodiment of the invention, the method can be used to produce circuit boards having traces of superconducting materials deposited directly thereon. In this embodiment, the substrate is masked using any of the masks as previously described and exposed to a vapor of superconducting material in a vacuum. The superconducting material is deposited directly onto the substrate, thereby providing a superconducting pattern on a substrate useful, for example, in the production of circuit boards. In a preferred embodiment of the process for producing superconducting circuit boards, subsequent to the deposition of the superconducting material, a metal layer, such as is used in conventional circuit boards is preferably deposited upon the superconducting material. This metal layer can serve as a means for providing electrical contact to the superconducting material and also can serve as an alternate current path upon the circuit board should superconductivity be lost. Such superconducting circuit boards would be particularly well suited for applications in high-frequency circuitry, high current circuitry, and applications using superconducting microprocessors.

The method of the present invention can be used to produce layers of pattern material having thicknesses comparable with those of the thin foil circuit boards produced by conventional processes. Additionally, the present method allows the production of material patterns on substrates which are substantially thinner than those produced by current methods. Such ultra-thin patterns are expected to exhibit similar performance to their thicker, conventionally manufactured counterparts, especially in digital circuit applications, while displaying significant savings in material cost and production time. Additionally, regions of the thin pattern layers can be easily removed using low power lasers. This allows the pattern layer to be deposited to form impedance controlled circuits which subsequently can be precisely "tuned" using the laser to remove excess pattern material. Low power lasers are preferred as they can provide precise removal of the pattern material without damaging the substrate upon which the pattern is deposited.

Furthermore, as the present invention eliminates the need to etch the pattern upon the substrate, the etchant action on the pattern sideways, referred to as the etch factor, has been eliminated. This allows the deposition of patterning material traces which are narrow and have sidewalls which are othogonal to the substrate surface, thereby allowing the production of circuit boards having high device densities.

The invention will now be more particularly pointed out in the following exemplification.

Exemplification

A substrate comprising a 1 mil film of polyimide (Kapton TM Dupont) was provided. The mask was a 0.005 in. magnetic stainless steel sheet which had been previously patterned. The substrate film was placed upon a base material and the mask was subsequently placed upon the substrate. The mask was immobilized by a magnetic field produced by a magnet located below the based upon which the substrate and mask were located.

The atmosphere surrounding the masked substrate was evacuated to a pressure in the range of about $10^{-3}$ to about $10^{-4}$ torr. The masked substrate was then exposed to vapor phase aluminum for about 10 to 15 seconds.

Subsequently, the atmosphere surrounding the masked substrate was vented to ambient pressure and the mask was removed. An aluminum pattern was found to be fabricated upon the substrate in the substrate regions which were exposed to the vapor phase aluminum. Based upon subsequent calculations, this aluminum pattern layer is believed to be on the order of about 15,000 Å thick.

Equivalents

Those skilled in the art will recognize or be able to ascertain, using no more than routine experimentation, many equivalents to the specific embodiments described herein. Such equivalents are intended to be encompassed by the following claims.

I claim:

1. An etchless patterning method for the direct vapor deposition of a desired material pattern on a substrate, the method comprising the steps of:
   a. immobilizing a reusable, patterned physical mask upon a mask carrier, the mask being cut out in a desired physical pattern;
   b. contacting the immobilized mask with a surface of the substrate in a manner such that the mask is immobilized upon such surface;
   c. removing the carrier from the immobilized mask on the substrate surface;
   d. vapor depositing a pattern material through said mask and onto the substrate thereby forming traces of the desired material pattern on said substrate;
   e. reimmobilizing the mask upon the mask carrier; and
   f. removing the patterned mask from the substrate surface in a manner such that the mask remains immobilized upon the mask carrier.

2. An etchless patterning method of claim 1 wherein the substrate is an electrically insulating, solid, polymeric material.

3. An etchless patterning method of claim 1 wherein the pattern material is selected from the group consisting of metals and metallic alloys, polymeric materials, elemental carbon, inorganic materials and combinations thereof.

4. An etchless patterning method of claim 1 wherein the vapor phase pattern material is provided by a method selected from the group consisting of chemical vapor deposition and physical vapor deposition.

5. An etchless patterning method of claim 1 wherein the patterned mask comprises a material selected from the group consisting of metals metallic alloys, ceramics and polymeric materials.

6. An etchless patterning method of claim 1 wherein the patterned mask is maintained in intimate contact with the substrate surface via magnetic attraction.

7. An etchless patterning method of claim 5 wherein the mask carrier is etch-resistant.

8. An etchless patterning method of claim 7 wherein the mask carrier comprises titanium.

9. An etchless patterning method of claim 5 wherein the patterned mask is continuously immobilized and the continuous immobilization is provided by magnetic attraction.

10. An etchless patterning method of claim 1 wherein the substrate comprises a circuit board substrate containing through-holes.

11. An etchless patterning method of claim 10 wherein the through-holes are countersunk on at least one substrate surface.

12. An etchless patterning method of claim 10 wherein the pattern material is deposited on the interior surfaces of the through-holes simultaneously with the deposition on the substrate surface.

13. An etchless patterning method of claim 1 wherein the pattern material comprises a superconducting material.

14. An etchless patterning method of claim 10 wherein conductive contact pads are deposited on at least one pattern region subsequent to pattern deposition.

15. An etchless patterning method of claim 14 wherein the conductive contact pads comprise a Ni-Au multilayer.

16. An etchless patterning method of claim 10 wherein conductive device mounting pads are deposited on at least one pattern region subsequent to pattern deposition.

17. An etchless patterning method of claim 16 wherein the conductive device mounting pads comprise solder.

18. A method as in claim 1 wherein the mask contains isolated mask sections which are maintained in proper orientation to the pattern throughout immobilization and substrate patterning.

19. A method for directly depositing a metallic pattern on a substrate, the method comprising the steps of:
   a. immobilizing a reusable, solid, patterned mask upon a mask carrier, the mask being cut out in a desired material pattern;
   b. contacting the immobilized mask with a surface of the substrate in a manner such that the mask is immobilized upon such surface;
   c. removing the carrier from the immobilized mask on the substrate surface;
   d. vapor depositing a metallic pattern material through said mask and onto the substrate thereby forming metallic traces of the desired material pattern in direct contact with the substrate;
   e. reimmobilizing the mask upon the mask carrier; and
   f. removing the reusable, solid, patterned mask from the substrate surface in a manner such that the mask remains immobilized upon the mask carrier.

20. An etchless patterning method of claim 19 wherein the metallic pattern material is selected from the group consisting of gold, silver, copper, aluminum and combinations thereof.

21. An etchless patterning method of claim 19 wherein the solid, patterned mask comprises a material selected from the group consisting of metals, metallic alloys, ceramics and polymeric materials.

22. An etchless patterning method of claim 19 wherein the solid, patterned mask is maintained in intimate contact with the substrate via magnetic attraction.

23. A method as in claim 19 wherein the mask contains isolated mask sections which are maintained in proper orientation to the pattern throughout immobilization and substrate patterning.

24. A method for the production of circuit boards, the method comprising the steps of:
 a. providing a circuit board substrate having a plurality of through-holes;
 b. immobilizing a reusable, solid, patterned mask upon a mask carrier, the mask being cut out in the desired pattern;
 c. contacting the immobilized mask with a surface of the substrate in a manner such that the mask is immobilized upon such surface and registered to provide proper orientation with the substrate through-holes;
 d. removing the carrier from the immobilized mask on the substrate surface;
 e. vapor depositing an electrically conductive or superconductive pattern material through said mask and onto the substrate thereby forming electrically conductive or superconductive traces of the desired material pattern in direct contact with the substrate and electrically conductive or superconductive pattern material on interior surfaces of the substrate through-holes;
 f. reimmobilizing the mask upon the mask carrier; and
 g. removing the reusable, solid, patterned mask from the substrate surface in a manner such that the mask remains immobilized upon the mask carrier to thereby provide a circuit board having a patterned electrically conductive or superconductive material deposited on the substrate surface, said patterned material being integrally continuous with pattern material deposited upon the inner surfaces of the substrate through-holes.

25. An etchless patterning method of claim 24 wherein the through-holes are countersunk on at least one substrate surface.

26. A method as in claim 24 wherein the mask contains isolated mask sections which are maintained in proper orientation to the pattern throughout immobilization and substrate patterning.

27. An etchless method for the production of circuit boards, the method comprising the steps of:
 a. providing a circuit board substrate on a substrate carrier surface, the substrate having a plurality of through-holes;
 b. immobilizing a patterned physical mask on a mask carrier surface via a first magnetic means;
 c. contacting the mask with the substrate surface while registering the mask to provide proper orientation with the substrate through-holes;
 d. disengaging the first magnetic means while immobilizing the mask on the substrate surface via a second magnetic means;
 e. removing the mask carrier surface;
 f. vapor depositing a pattern material through the mask and onto the substrate to thereby form a desired material pattern on the substrate and on the interior surfaces of substrate through-holes;
 g. replacing the mask carrier surface upon the mask;
 h. disengaging the second magnetic means while immobilizing the mask on the mask carrier surface via the first magnetic means; and,
 i. removing the mask to thereby provide a circuit board having a pattern material deposited on the substrate surface and on the interior surfaces of substrate through-holes.

28. A method of claim 27 wherein the substrate through-holes are countersunk on at least one substrate surface.

29. A method of claim 27 wherein the mask carrier surface comprises titanium.

30. A method of claim 27 wherein at least one of said first or said second magnetic means comprises an electromagnet.

31. A method for forming a desired material pattern on a substrate, the method comprising the steps of:
 a. immobilizing a mask material on a mask carrier;
 b. completely removing mask material from regions defining the ultimate desired material pattern, to thereby provide an immobilized, reusable, patterned mask upon a mask carrier;
 c. contacting the immobilized mask with a surface of the substrate in a manner such that the mask is immobilized upon such surface;
 d. removing the carrier from the immobilized mask on the substrate surface;
 e. vapor depositing a pattern material through said mask and onto the substrate, thereby forming traces of the desired material pattern on said substrate;
 f. reimmobilizing the mask upon the mask carrier; and
 g. removing the patterned mask in a manner such that the mask remains immobilized upon the mask carrier.

32. A method as in claim 31 wherein the mask contains isolated mask sections which are maintained in proper orientation to the pattern throughout immobilization and patterning.

* * * * *